(12) United States Patent
Kim

(10) Patent No.: US 7,894,022 B2
(45) Date of Patent: *Feb. 22, 2011

(54) PERIPHERAL LIGHT SENSOR AND LIQUID CRYSTAL DISPLAY DEVICE USING THE SAME

(75) Inventor: Sang Uk Kim, Suwon-si (KR)

(73) Assignee: Samsung Mobile Display Co., Ltd, Suwon-si, Gyeonggi-do (KR)

( * ) Notice: Subject to any disclaimer, the term of this patent is extended or adjusted under 35 U.S.C. 154(b) by 755 days.

This patent is subject to a terminal disclaimer.

(21) Appl. No.: 11/898,120

(22) Filed: Sep. 10, 2007

(65) Prior Publication Data

US 2008/0151161 A1     Jun. 26, 2008

(30) Foreign Application Priority Data

Dec. 21, 2006   (KR) .................... 10-2006-0131857

(51) Int. Cl.
  *G02F 1/136*    (2006.01)
  *G02F 1/1333*   (2006.01)
  *G02F 1/1335*   (2006.01)

(52) U.S. Cl. .................... 349/106; 349/46; 349/110; 345/102; 250/214

(58) Field of Classification Search ............... 349/46, 349/106, 110; 250/214
See application file for complete search history.

(56) References Cited

U.S. PATENT DOCUMENTS

| | | | |
|---|---|---|---|
| 6,809,718 B2* | 10/2004 | Wei et al. | ..................... 345/102 |
| 7,679,043 B2* | 3/2010 | Kim | .................... 250/214 AL |
| 2006/0017871 A1 | 1/2006 | Morimoto et al. | |
| 2006/0027732 A1 | 2/2006 | Ahn | |
| 2008/0253498 A1* | 10/2008 | Dupont et al. | ................. 377/19 |
| 2009/0243993 A1* | 10/2009 | Kuga | .......................... 345/102 |
| 2009/0251402 A1* | 10/2009 | Hsieh et al. | ................. 345/102 |

FOREIGN PATENT DOCUMENTS

| | | |
|---|---|---|
| JP | 2002-023658 | 1/2002 |
| JP | 2006-251636 A | 9/2006 |
| KR | 10-2003-0075317 A | 9/2003 |
| KR | 10-2006-0101011 A | 9/2006 |

\* cited by examiner

*Primary Examiner*—Julie-Huyen L Ngo
(74) *Attorney, Agent, or Firm*—Lee & Morse, P.C.

(57) ABSTRACT

A peripheral light sensor may include at least two transistors connected between an output line and a ground power source, a peripheral light sensing signal corresponding to an intensity of a peripheral light being output through the output line, and at least one color filter over a light receiving section of at least one of the transistors.

20 Claims, 5 Drawing Sheets

PERIPHERAL LIGHT SENSOR AND LIQUID CRYSTAL DISPLAY DEVICE USING THE SAME

BACKGROUND OF THE INVENTION

1. Field of the Invention

Embodiments of the present invention relate to a peripheral light sensor and a liquid crystal display device using the same. More particularly, embodiments of the invention relate to a peripheral light sensor and a liquid crystal display device, which have output characteristics similar to recognition characteristics of a human's sight.

2. Description of the Related Art

Various flat panel displays that are lower in weight and volume than cathode ray tubes (CRTs) are being developed. Flat panel displays include liquid crystal displays (LCDs), field emission displays (FEDs), plasma display panels (PDP), and organic light emitting displays.

LCDs generally have characteristics such as small-size, light-weight, and low power consumption, and thus, are being used more often in lieu of CRTs. At present, LCDs are being used in large and small devices. More particularly, e.g., LCDs are currently being used in computer monitors and TV screens, portable phones and personal digital assistants (PDAs). LCDs are emitting type display devices, and adjust an amount of light penetrating a liquid crystal layer by the refraction rate anisotropy of liquid crystal molecules to display desired images.

In LCDs, a back light may output light of constant brightness to a pixel portion. Although much light may not be required to provide a desired degree of recognition when ambient or external light is dark, light of constant brightness may still be supplied to the pixel portion. As a result, power consumption of the back light may be increased. Generally, the back light may consume greater than 80% of the power required to drive the LCD. Therefore, methods and/or devices for reducing power consumption of the back light are desired.

SUMMARY OF THE INVENTION

Embodiments of the present invention are therefore directed to peripheral light sensors and LCDs employing such a peripheral light sensor, which substantially overcome one or more of the problems due to the limitations and disadvantages of the related art.

It is therefore a feature of an embodiment of the present invention to provide a peripheral light sensor and an LCD employing such a peripheral light sensor adapted to reduce power consumption by sensing peripheral light, and when the sensed peripheral light has brightness less than a predetermined brightness, an amount of light generated by the back light may be reduced.

It is therefore a separate feature of an embodiment of the present invention to provide a peripheral light sensor and an LCD employing such a peripheral light sensor adapted to sense peripheral light such that output characteristics of the sensor sensing peripheral light may be similar to recognition characteristic of a human's eyes, i.e., sight.

Accordingly, it is an aspect of the present invention to provide a peripheral light sensor having output characteristics similar to recognition characteristics of human sight, and a liquid crystal display device for reducing power consumption using the same.

At least one of the above and other features and advantages of the present invention may be realized by providing a peripheral light sensor, including at least two transistors connected between an output line and a ground power source, a peripheral light sensing signal corresponding to an intensity of a peripheral light being output through the output line, and at least one color filter over a light receiving section of at least one of the transistors.

The color filter may be one of red, green, and blue color filters. The peripheral light sensor may include a first substrate on which the transistors are arranged, a second substrate facing the first substrate, a black matrix between the transistors and the second substrate, the black matrix including at least one opening portion, wherein the light receiving section may overlap the opening portion of the black matrix.

The color filter may be disposed in at least a part of the opening portion of the black matrix to overlap with the light receiving section of at least a portion of at least one of the transistors. The black matrix may overlap source and drain regions of the transistors. The light receiving section of each transistor may be at least a portion of a gate electrode of the respective transistor. Gate electrodes of the transistors may be coupled to the ground power source and respective first electrodes thereof, the ground power source has a voltage value less than a maximal value of a voltage supplied to the output line.

A pulse wave signal swing between a first voltage and a second voltage may be supplied to the output line of the peripheral light sensor, the second voltage has a greater voltage value than that of the first voltage. The voltage value of the first voltage may be identical with that of the ground power source, and the voltage value of the second voltage may be set to be greater than that of the ground power source.

The transistors may control a current amount flowing to the first electrode from a second electrode corresponding to an intensity of the peripheral light input to a gate electrode of the respective transistor. The light receiving section of at least one of the two transistors may overlap a green color filter, the light receiving section of at least another of the two transistors overlaps a blue color filter, and the light receiving section of a third transistor overlaps a red color filter. The light receiving section of a fourth transistor may not overlap a color filter.

At least one of the above and other features and advantages of the present invention may be separately realized by providing a liquid crystal display device, including a pixel portion including a plurality of liquid crystal cells, at least one peripheral light sensor outputting a peripheral light sensing signal corresponding to an intensity of peripheral light sensed thereby, a back light for supplying light to the pixel portion, and a back light driver for controlling a luminance of light generated by the back light corresponding to the peripheral light sensing signal, wherein the peripheral light sensor includes at least two transistors connected between an output line and a ground power source, the peripheral light sensing signal being output through the output line, and at least one color filter installed at a light receiving section of at least one of the transistors.

The liquid crystal display device may include a black matrix, a first substrate and a second substrate, wherein the first substrate may face the second substrate, the at least two transistors may be arranged on the first substrate, the black matrix may be arranged between the first substrate and the second substrate, and the at least one peripheral light sensor overlaps the black matrix. The peripheral light sensor overlaps the black matrix at a peripheral region of the pixel portion. The black matrix may include at least one opening portion, and the light receiving sections of the transistors overlap the opening portion.

Gate electrodes of the transistors may correspond to the light receiving section of the transistors. The color filter may be one of red, green, and blue color filters. Gate electrodes of the transistors may be coupled to a ground power source and first electrodes thereof, the ground power source may have a voltage value less than a maximal value of a voltage supplied to the output line. The transistors may control a current amount flowing to the first electrode from a second electrode corresponding to an intensity of the peripheral light input to a gate electrode.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
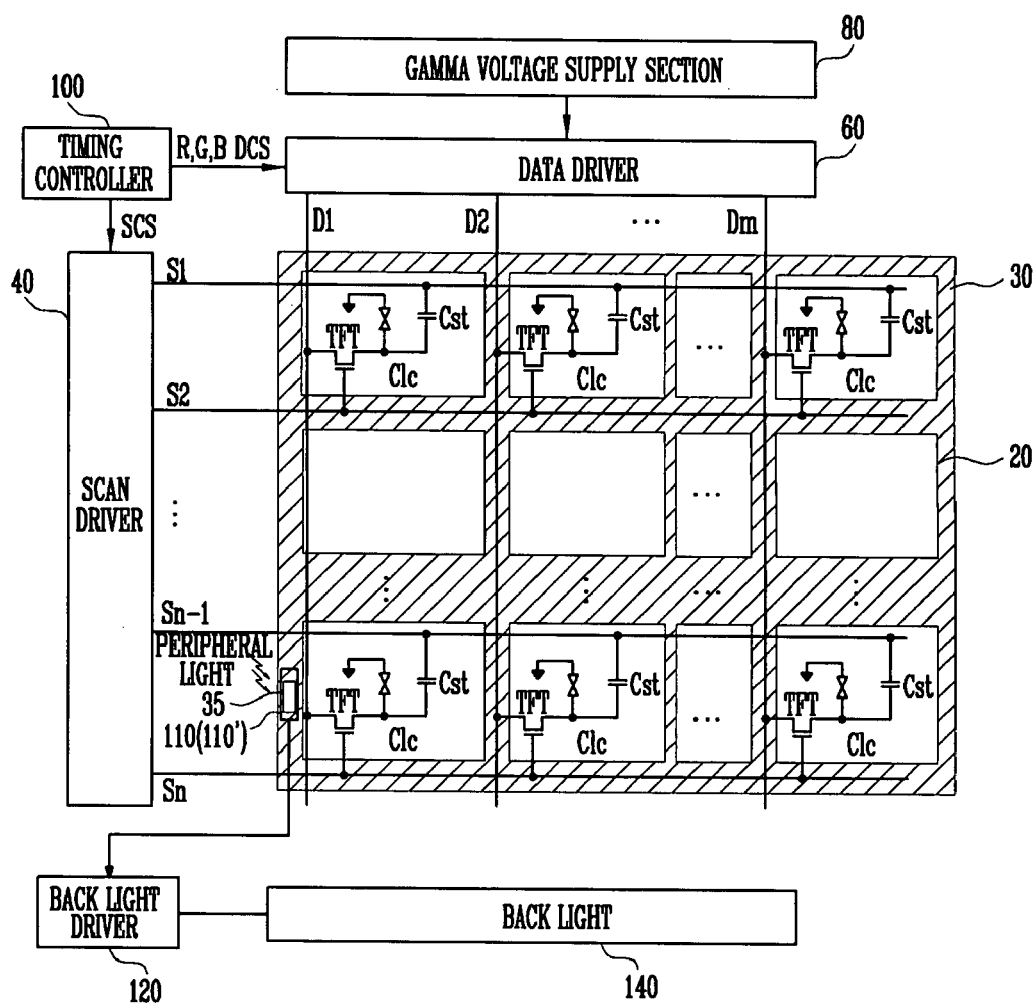
FIG. 1 illustrates a diagram of an LCD according to an exemplary embodiment of the present invention.

Korean Patent Application No. 10-2006-0131857, filed on Dec. 21, 2006, in the Korean Intellectual Property Office, and entitled: "Peripheral Light Sensor and Liquid Crystal Display Device Using the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of elements and regions may be exaggerated for clarity of illustration. It will also be understood that when an element is referred to as being "on" another element, it can be directly on the other element, or intervening elements may also be present. Further, it will be understood that when an element is referred to as being "under" or "overlapping" another element, it can be directly under and/or directly overlapping, and one or more intervening elements and/or space(s) may also be present. In addition, it will also be understood that when an element is referred to as being "between" two elements, it can be the only element between the two elements, or one or more intervening layers may also be present.

Hereinafter, embodiments according to the present invention will be described with reference to the accompanying drawings, namely, FIG. 1 to FIG. 7C. Here, when one element is connected to another element, one element may be not only directly connected to another element, but also may be indirectly connected to another element via another element. Further, irrelevant elements may be omitted for clarity. Also, like reference numerals refer to like elements throughout the specification.

FIG. 1 illustrates a diagram of an LCD according to an exemplary, embodiment of the present invention. Although FIG. 1 illustrates an active matrix LCD, embodiments of the present invention is not limited thereto.

With reference to FIG. 1, the LCD according to an embodiment of the present invention may include a pixel portion 20, a scan driver 40, a data driver 60, a gamma voltage supply section 80, a timing controller 100, a peripheral light sensor 110, 110', a back light driver 120, and a back light 140. The peripheral light sensor(s) 110, 110' may be formed in at least one region of a black matrix 30. The black matrix 30 may be formed at a peripheral portion of the pixel portion 20. An opening portion(s) 35 may be formed at the black matrix 30. Peripheral light may be incident to the at least one region of the peripheral light sensor(s) 110, 110' through the opening portion 35. When the peripheral light is incident to the peripheral light sensor(s) 110, 110', the peripheral light sensor(s) 110, 110' may generate a peripheral light sensing signal corresponding to an intensity of the peripheral light to control the back light driver 120.

The pixel portion 20 may include a plurality of liquid crystal cells Clc, at least one thin film transistor (TFT), and a storage capacitor Cst. A plurality of liquid crystal cells Clc may be arranged at intersections of data lines D1 to Dm and scan lines S1 to Sn. One TFT may be formed for each of the liquid crystal cells Clc. The TFT may provide a data signal supplied from a data line D to the liquid crystal cell Clc corresponding to a scan signal. The storage capacitor Cst may be arranged, e.g., between a pixel electrode of the liquid crystal cell Clc and a scan line S of a previous state or between the pixel electrode of the liquid crystal cell Clc and a common electrode line to maintain a voltage of the liquid crystal cell Clc constant or substantially constant during a frame. More particularly, e.g., for a liquid crystal cell Clc being driven by the second scan line S2, the respective storage capacitor Cst may be arranged between the pixel electrode of the liquid crystal cell Clc and the first scan line S1. Accordingly, when the scan signal is supplied to the respective scan line S1 to Sn, an arranged angle of a liquid crystal may change corresponding to the data signal. Light transmittance may change according to a change of the arranged angle to display a desired image. The black matrix 30 may be formed between the liquid crystal cells Clc and a peripheral portion of the pixel portion 20 to absorb light incident from an adjacent cell or a peripheral portion of the pixel portion 20, thereby preventing and/or reducing image contrast from being deteriorated.

The scan driver 40 may sequentially provide the scan signal to the scan lines S1 to Sn corresponding to a scan control signal SCS supplied from the timing controller 100 to select a horizontal line of the pixel portion 20 to which the data signal is supplied.

The data driver 60 may convert digital video data R, G, and B into an analog gamma voltage corresponding to a data control signal DCS supplied from the timing controller 100, i.e., a data signal, and may provide the data signal to the data lines D1 to Dm.

The gamma voltage supply section 80 may supply a plurality of gamma voltages to the data driver 60.

The timing controller 100 may generate the respective scan control signal SCS and the respective data control signal DCS to control the scan driver 40 and the data driver 60, respectively, using vertical/horizontal synchronous signals Vsync and Hsync, and an external clock signal CLK. The scan control signal SCS for controlling the scan driver 40 may include a gate start pulse, a gate shift clock, and a gate output signal. The data control signal DCS for controlling the data driver 60 may include a source start pulse, a source shift clock, a source output signal, and a polarity signal. Further, the timing controller 100 may rearrange externally supplied data R, G, and B, and may provide the data R, G, and B to the data driver 60.

The peripheral light sensor(s) 110, 110' may be arranged in at least one region of the black matrix 30. More particularly, the peripheral light sensors 110, 110' may be arranged at the opening portion(s) 35 of the black matrix 30. Namely, at least a portion of the peripheral light sensor(s) 110, 110' may be exposed to peripheral light via the respective opening portion(s) 35 of the black matrix 30, and thus, peripheral light may be incident to the peripheral light sensor(s) 110, 110'. After the peripheral light sensor(s) 110, 110' receive the peripheral light, the peripheral light sensor(s) 110, 100' may generate and provide a peripheral light sensing signal corresponding to an intensity of the peripheral light to the back light driver 120, and may thereby control the back light driver 120.

The back light driver 120 may supply the back light 140 with a drive voltage (or current) for driving the back light 140. The back light driver 120 may change a value of the drive voltage (or current) corresponding to the peripheral light sensing signal supplied by the peripheral light sensor(s) 110, 110' to control luminance of light generated in the back light 140. For example, when the back light driver 120 receives a peripheral light sensing signal corresponding to peripheral light of a low intensity from the peripheral light sensor(s) 110, 110', the back light driver 120 may reduce the drive voltage (or current) of the back light 140 by a predetermined value corresponding to the intensity of the peripheral light to reduce luminance of light generated in the back light 140, and may thereby reduce power consumption.

In contrast, when, e.g., the back light driver 120 receives a peripheral light sensing signal corresponding to peripheral light having an intensity greater than a predetermined intensity from the peripheral light sensor(s) 110, 110', the back light driver 120 may not change an amplitude of the drive voltage (or current) of the back light 140 such that luminance of the light generated in the back light 140 may be maintained, e.g., not reduced, and may thereby prevent and/or reduce deterioration of luminance characteristics of the pixel portion 20.

FIG. 1 illustrates an exemplary embodiment with a single peripheral light sensor 110 or 110'. However, embodiments of the present invention are not limited thereto. For example, a plurality of peripheral light sensors 110, 110' may be provided. More particularly, e.g., a plurality of peripheral light sensors 110, 110' may be arranged in one or more opening portions 35 of the black matrix 30. That is, in embodiments of the invention, a number of peripheral light sensors 110, 110' may be variously set, e.g., at least one.

The back light 140 may generate light corresponding to a drive voltage (or current) supplied from the back light driver 120, and may supply the light to the pixel portion 20.

The liquid crystal display device according to an exemplary embodiment of the present invention as described above may include peripheral light sensor(s) 110, 110' to sense an intensity of a peripheral light to control luminance of light generated by the back light 140 based on the sensed intensity of peripheral light. Accordingly, power consumption may be reduced. Furthermore, in embodiments of the invention, when it is sensed that the intensity of peripheral light is equal to or greater than a predetermined value, the back light driver 120 may not trigger a reduction in luminance of light generated in the back light 140, and may thereby prevent deterioration of luminance characteristics of the pixel portion 20.

Figure 2:
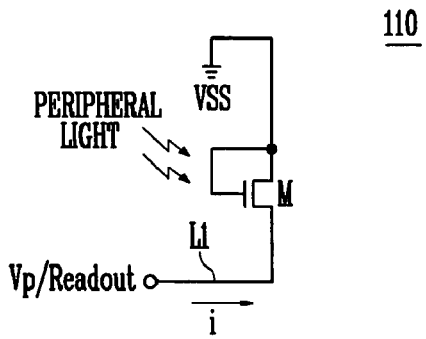
FIG. 2 illustrates a circuit diagram of an exemplary peripheral light sensor.

FIG. 2 illustrates a circuit diagram of the exemplary peripheral light sensor 110 shown in FIG. 1.

With reference to FIG. 2, the peripheral light sensor 110 may include an optical sensing transistor(s) M, which may be coupled between an output line L1 and a ground power source VSS. The peripheral light sensing signal may be output through the output line L1.

More particularly, a first electrode of the transistor(s) M may be coupled to a ground power source VSS set by a ground GND voltage, and a second electrode thereof may be coupled to the output line L1 of the peripheral light sensor 110. The first electrode of the transistor(s) M may correspond to one of a source or a drain, and the second electrode of the transistor(s) M may correspond to the other of the source or the drain of the transistor(s) M.

Further, the output line L1 may sense an amplitude of an electric current flowing to the peripheral light sensor 110, and may receive a pulse wave signal Vp. For example, the output line L1 may receive a pulse wave signal Vp corresponding to a voltage swing between a first voltage and a second voltage, and may sense an amplitude of an electric current i flowing through the transistor(s) M. The first voltage may be a ground voltage. The second voltage may have a value greater than the ground voltage.

A gate electrode of the transistor(s) M may be coupled to the first electrode of the transistor(s) M and the ground power source VSS. That is, the gate electrode of the transistor(s) M may be coupled to the first electrode of the transistor(s) M, such that the transistor(s) M may be reverse-diode-connected. The first electrode may receive a voltage less than that of the second electrode. The gate electrode of the transistor(s) M may be disposed at the respective opening portion 35 of the black matrix 30, and may receive peripheral light.

When peripheral light is incident on the gate electrode of the transistor(s) M and a pulse wave signal Vp is supplied to the second electrode, the transistor(s) M may flow an electric current corresponding to an intensity of the peripheral light. That is, an electric current i corresponding to an intensity of the peripheral light may flow from the second electrode to the first electrode of the transistor(s) M.

Accordingly, an electric current corresponding to, e.g., that is the same as, the electric current flowing through the transistor(s) M may flow through the output line L1. The peripheral light sensor 110 may read the electric current to sense an intensity of the peripheral light. Namely, the electric current flowing through the output line L1 of the peripheral light sensor 110 may correspond to the peripheral light sensing signal.

In the exemplary peripheral light sensor 110 shown in FIG. 2, the transistor(s) M is reverse-diode-connected, so that an electric current corresponding to an intensity of the peripheral light may be linearly changed and the peripheral light may be reliably sensed.

Figure 3:
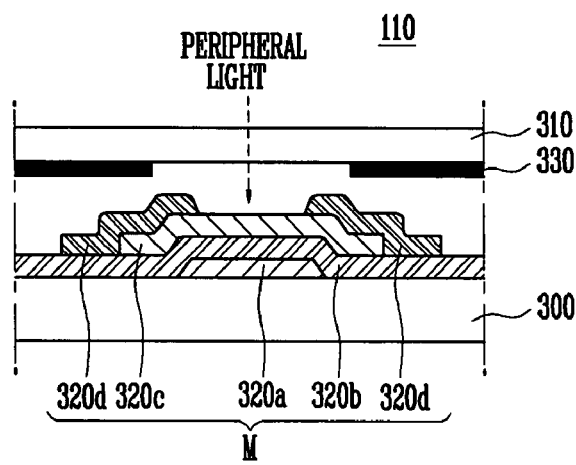
FIG. 3 illustrates a cross-sectional diagram of main parts of the peripheral light sensor shown in FIG. 2.

FIG. 3 illustrates a cross-sectional diagram of main parts of the peripheral light sensor shown in FIG. 2.

With reference to FIG. 3, the transistor(s) M may be disposed between a first substrate 300 and a second substrate 310. The transistor(s) M may include a gate electrode 320a, a gate insulation film 320b, a semiconductor layer 320c, and source and drain electrodes 320d. The gate electrode 320a may be formed on the first substrate 300. The gate insulation film 320b may be formed on the gate electrode 320a. The semiconductor layer 320c may be formed on the gate insulation film 320b. The source and drain electrodes 320d may be formed on the semiconductor layer 320c.

The gate electrode 320a of the transistor(s) M may be disposed at the opening portion 35 of the black matrix 330, and may receive incident peripheral light. At least a portion of the source and drain electrodes 320d may overlap with the black matrix 330. Namely, a light receiving section of the peripheral light sensor 110 may be disposed at the opening portion 35 of the black matrix 330, and may overlap the gate electrode 320a.

When peripheral light is incident on the light receiving section, e.g., the gate electrode 320a of the transistor(s) M, an electric current i corresponding to an intensity of the peripheral light may flow through the semiconductor layer 320c, so that the intensity of the peripheral light may be sensed.

However, since the peripheral light sensor 110 shown in FIG. 2 and FIG. 3 may include the transistor(s) M, a response curve, namely, output characteristics of the peripheral light sensor 110 with respect to a wavelength of light may depend on characteristics of the transistor(s) M. However, because the output characteristics of the peripheral light sensor 110 may be different from recognition characteristics of human sight, there is a further need for a peripheral light sensor having output characteristics similar to the user's, e.g., human's, recognition characteristics.

Figure 4:
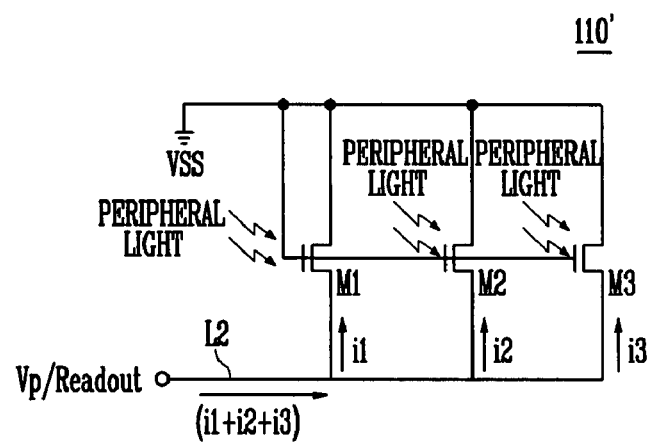
FIG. 4 illustrates a circuit diagram of another exemplary peripheral light sensor.
Figure 5:
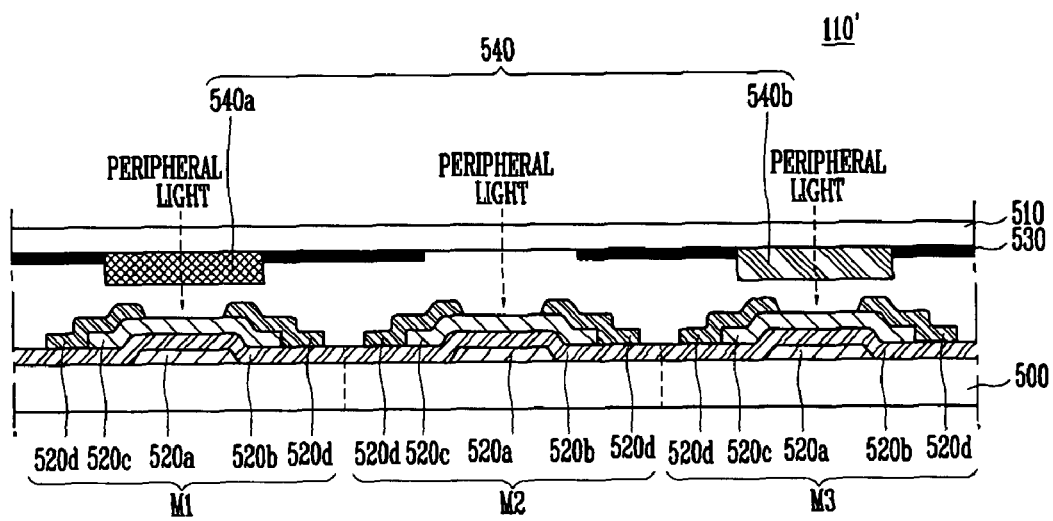
FIG. 5 illustrates a cross-sectional diagram of main parts of the peripheral light sensor shown in FIG. 4.

Thus, in some embodiments of the invention, the peripheral light sensor 110' having output characteristics similar to the user's recognition characteristics may be employed. FIG. 4 illustrates a circuit diagram of another exemplary peripheral light sensor 110'; and FIG. 5 illustrates a cross-sectional diagram of main parts of the peripheral light sensor 110' shown in FIG. 4. The exemplary embodiment of the peripheral light sensor 110' shown in FIGS. 4 and 5 may be employed to efficiently control the back light driver 120 in view of an intensity of one or more of the primary colors of the peripheral light, so as to better correspond to user's recognition characteristics.

With reference to FIG. 4, the peripheral light sensor 110' may include transistors M1 to M3, which may be connected to each other in parallel between an output line L2 and the ground power source VSS. A peripheral light sensing signal may be output through the output line L2. In embodiments of the invention, a number of the transistors may be variously set, e.g., one, two, ten, etc. For convenience of the description, the exemplary embodiment of the invention illustrated in FIGS. 4 and 5 includes three transistors M1 to M3.

First electrodes of the transistors M1 to M3 may be coupled to the ground power source VSS, and second electrodes thereof may be coupled to an output line L2 of the peripheral light sensor 110'. Gate electrodes of the transistors M1 to M3 may be coupled to first electrodes thereof and the ground power source VSS. The transistors M1 to M3 may be connected to each other in parallel, and respective transistors M1 through M3 may be reverse-diode-connected.

Here, gate electrodes of the transistors M1 to M3 may be positioned at the respective opening portion(s) 35 of the black matrix 30 to receive peripheral light. That is, a plurality of opening portions 35 may be formed at the black matrix 30.

Further, at least one of the gate electrodes of the transistors M1 to M3 may be disposed to overlap with a color filter 540 (see FIG. 5) arranged at the respective opening portion 35 of the black matrix 30. That is, at least one of the transistors M1 to M3 may receive peripheral light incident on the color filter.

When a pulse wave signal Vp swinging between the first voltage and the second voltage is supplied to the output line L2 of the peripheral light sensor 110' and the peripheral light is incident to a light receiving section of the peripheral light sensor 110', e.g., to the gate electrodes of the transistors M1 to M3, the transistors M1 to M3 may control an amount of an electric current flowing from the first electrode to the second electrode corresponding to an intensity of a peripheral light, which is incident to respective gate electrodes thereof.

Accordingly, an electric current (i1+i2+i3) being a sum of electric currents i1, i2, i3 flowing through the transistors M1 to M3, may flow to the output line L2 of the peripheral light sensor 110'.

Because a light receiving section of at least one of the transistors M1 to M3 may receive peripheral light incident through a color filter, e.g., a red, green, or blue color filter, output characteristics with respect to a wavelength of light may be different in comparison with a case in which the peripheral light is incident without the color filter(s).

Accordingly, in some embodiments of the present invention, output characteristics with respect to a wavelength of light of at least one of the transistors M1 to M3 may be changed using a color filter in order to embody the peripheral light sensor 110' having output characteristics similar to recognition characteristics of human sight. A detailed description thereof will be explained later.

With reference to FIG. 5, transistors M1 to M3 may be disposed between a first substrate 500 and a second substrate 510. Each of the transistors M1 to M3 may include a gate electrode 520a, a gate insulation film 520b, a semiconductor layer 520c, and source and drain electrodes 520d. The gate electrode 520a may be formed on the first substrate 500. The gate insulation film 520b may be formed on the gate electrode 520a. The semiconductor layer 520c may be formed on the gate insulation film 520b. The source and drain electrodes 520d may be formed on the semiconductor layer 520c.

The gate electrodes 520a of the transistors M1, M2, M3 may be disposed at the respective opening portion of the black matrix 530, and may receive incident peripheral light. At least a portion of the source and drain electrodes 520d may overlap the black matrix 530.

Namely, a light receiving section of the peripheral light sensor 110' may be disposed at the respective opening portions 35 of the black matrix 530 to overlap with the gate electrode 520a.

When peripheral light is incident to the light receiving section, e.g., the gate electrode 520a of the transistors M1 to M3, electric currents i1 through i3 corresponding to an intensity of the peripheral light may flow through the respective semiconductor layers 520c, so that the intensity of the peripheral light can be sensed through a total of the electric currents i1+i2+i3 flowing through the output line L2.

The color filter 540 may be arranged at the light receiving section of at least one of the transistors M1 to M3, e.g., at the light receiving section of the first and third transistors M1 and M3 (namely, an opening portion of the black matrix 530 overlapping with the respective gate electrodes 520a of the first and third transistors), in the peripheral light sensor 110'.

In embodiments of the invention, a color filter of the same color can be installed at the first and third transistors M1 and M3, or a color filter of different colors can be installed. In the exemplary embodiment illustrated in FIG. 5, e.g., a green color filter 540a may be installed at a light receiving section of the first transistor M1, and a red color filter 540b may be installed at a light receiving section of the third transistor M3.

Accordingly, peripheral light of a special wavelength passing through the respective color filter arranged to overlap the respective light receiving section may be supplied to the first and third transistors M1 and M3. Consequently, the first and third transistors M1 and M3 may have unique output characteristics and a light transmittance corresponding to the respective color filter 540*a*, 540*b* may be combined and output.

Accordingly, a peripheral light sensing signal having the combined output characteristics may be output to the output line L2 of the peripheral light sensor 110'.

That is, in some embodiments of the present invention, the color filter 540 may be installed at a part of the respective light receiving sections of the peripheral light sensor 110' including the plurality of transistors M1 to M3 in order to change the output characteristics of the peripheral light sensor 110'.

Further, although FIG. 4 and FIG. 5 show only three transistors M1 to M3, the number of the transistors is not limited thereto. More or less transistors may be provided in the peripheral light sensor 110' and may be connected to each other in parallel.

Figure 6:
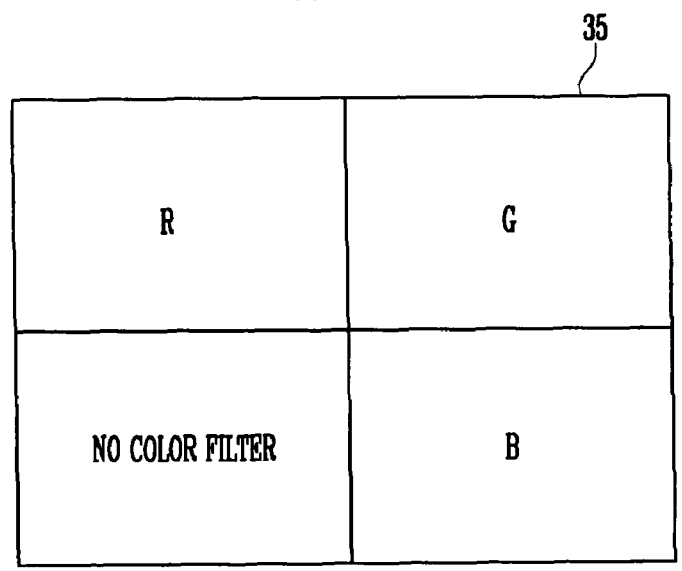
FIG. 6 illustrates an exemplary arrangement of color filters.

For example, as a quad arrangement of transistors, e.g., a first transistor for receiving peripheral light via a red color filter, a second transistor for receiving peripheral light via a green color filter, a third transistor for receiving peripheral light via a blue color filter, and a fourth transistor for receiving unfiltered peripheral light may be employed. FIG. 6 illustrates such an exemplary arrangement of four transistors relative to one opening portion 35 exposing three color filters R, G, B and a color-filter-free zone therein. Although not illustrated in FIG. 6, as described above, a respective transistor may be provided below each of the respective color filters R, G, B and the color-filter-free zone, and more particularly, at least a portion of the light receiving section, e.g., gate electrode, of the respective transistor may overlap the respective color filter R, G, B or color-filter-free zone. Further, although a single opening portion 35 is illustrated in FIG. 6, embodiments of the invention may include, e.g., separate opening portions 35 corresponding to each of the light receiving sections of the peripheral light sensor 110'.

Further, in some embodiments of the invention, a color filter may be installed to overlap at least a part of a light receiving section of at least one transistor of a peripheral light sensor to control output characteristics of the peripheral light sensor to be similar to recognition characteristics of human sight.

Hereinafter, a method for controlling the output characteristics of the peripheral light sensor 110' to be similar to recognition characteristics of human sight will be explained with reference to FIG. 7A to FIG. 7C.

Figure 7A:
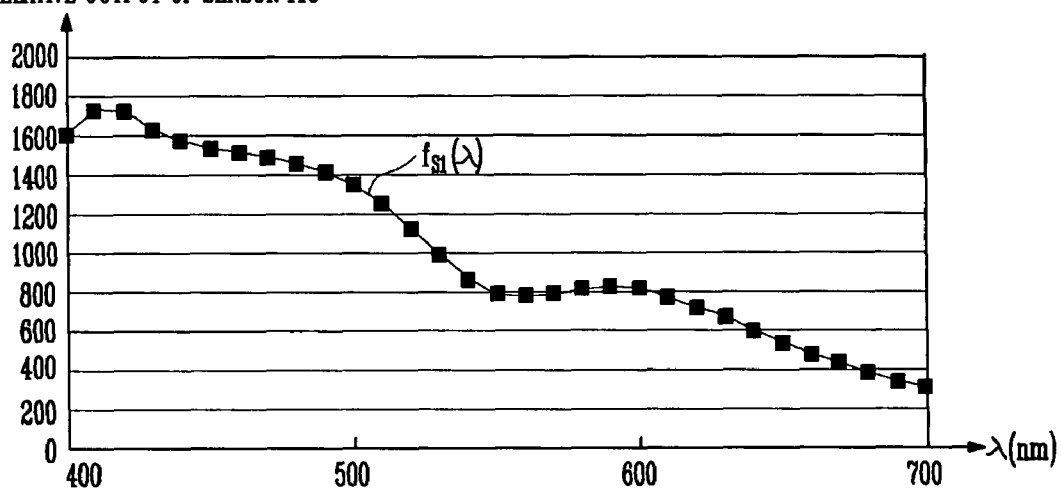
FIG. 7A illustrates a graph showing output characteristics, according to a wavelength of light, of the peripheral light sensor shown in FIGS. 2 and 3.
Figure 7B:
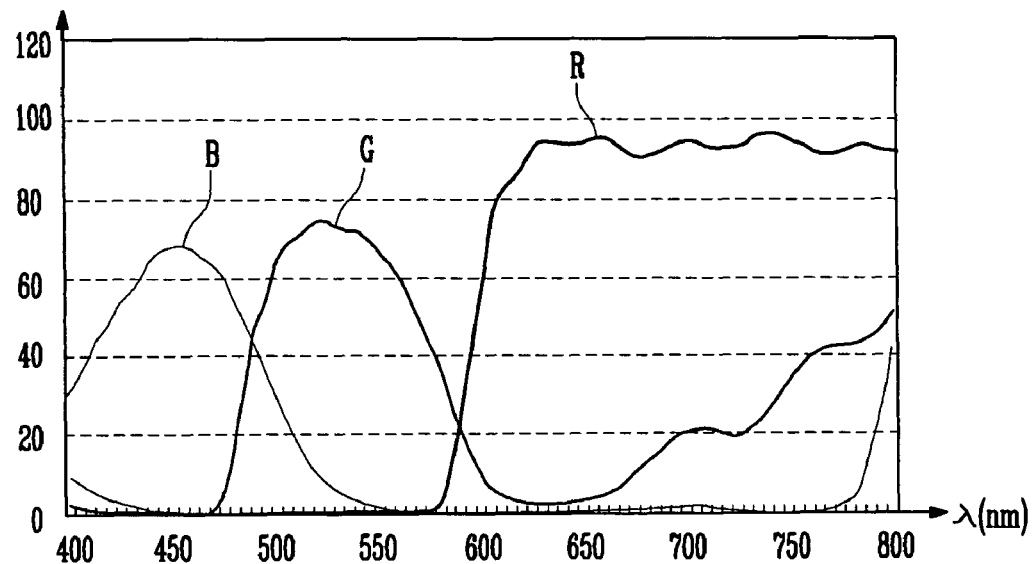
FIG. 7B illustrates a graph showing light transmittance according to wavelength of light of red, green, and blue color filters.
Figure 7C:
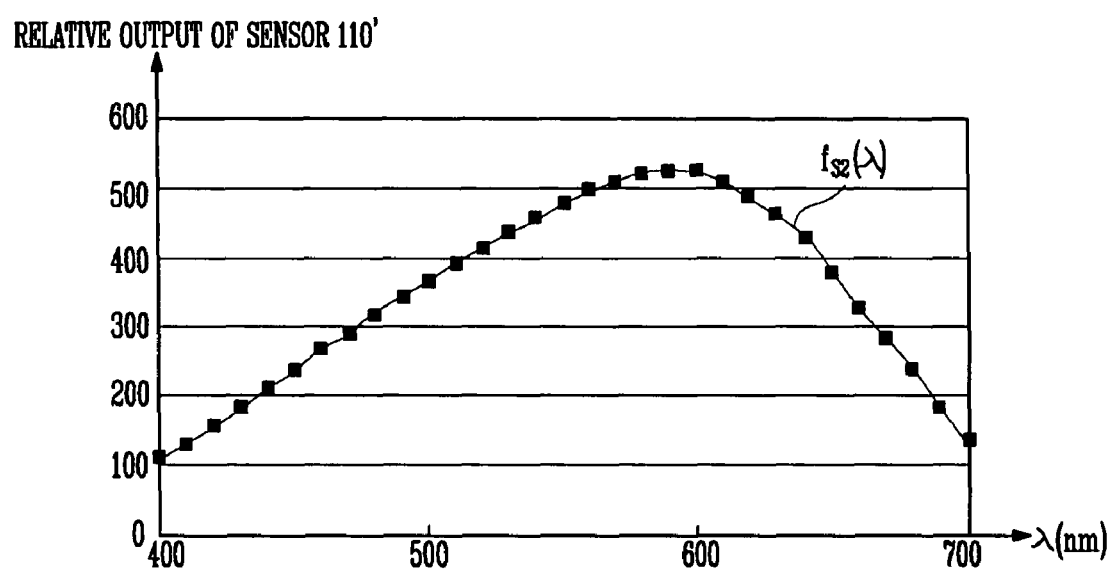
FIG. 7C illustrates a graph showing output characteristics according to wavelength of light of the peripheral light sensor shown in FIGS. 4 and 5.

FIG. 7A illustrates a graph showing output characteristics, according to wavelength of light, of the peripheral light sensor shown in FIGS. 2 and 3, FIG. 7B illustrates a graph showing light transmittance according to a wavelength of light of red, green, and blue color filters, and FIG. 7C illustrates a graph showing output characteristics according to wavelength of light of the peripheral light sensor shown in FIGS. 4 and 5.

With reference to FIG. 7A to FIG. 7C, output characteristics according to wavelength of peripheral light incident on the peripheral light sensor 110 shown in FIG. 2 and FIG. 3 in which a color filter is not installed at a light receiving section, has a characteristic function $f_{s1}(\lambda)$ as shown in FIG. 7A according to unique output characteristics of the transistor M. A graph of the characteristic function $f_{s1}(\lambda)$ shows a relative output of the peripheral light sensor 110 according to wavelength $\lambda$ of light. Furthermore, when the color filter 540 is not installed in the peripheral light sensor 110' shown in FIG. 4, it may have output characteristics similar to those shown in FIG. 7A.

In order to change the characteristic function $f_{s1}(\lambda)$ of FIG. 7A to be similar to the recognition characteristics of human sight, as shown in FIG. 4 and FIG. 5, a plurality of transistors M1 to M3 may be connected to each other in parallel, and a color filter 540 may be installed in at least one of the transistors M1 to M3.

More particularly, red (R), green (G), and blue (B) color filters 540 having light transmittance according to a wavelength $\lambda$ as shown in FIG. 7B may be suitably arranged at the transistors M1 to M3.

Accordingly, as shown in FIG. 7C, the peripheral light sensor 110' having the characteristic function $f_{s2}(\lambda)$ similar to the recognition characteristics of human sight may be embodied.

For example, in the peripheral light sensor 110' having N (N is a natural number) transistors connected to each other in parallel, a color filter is not installed at light receiving sections of u (u is a natural number ranging $1 \leq u \leq N$) transistors, but red, green, and blue color filters 540 are installed at x, y, and z (x, y, and z are natural numbers ranging $0 \leq x, y, z \leq N$) transistors to obtain output characteristic function $f_{s2}(\lambda)$ of the peripheral light sensor 110' as indicated in a following equation 1.

$$f_{s2}(\lambda) = kf_{s1}(\lambda) \times [u + xf_R(\lambda) + yf_G(\lambda) + zf_B(\lambda)] \qquad (1)$$

In equation 1, k is a proportional constant, fR($\lambda$), fG($\lambda$), and fB($\lambda$) are light transmittance characteristic functions of the red, green, and blue color filters, and a sum of u, x, y, and z is N (u+x+y+z=N).

That is, in embodiments of the present invention, the output characteristic function $f_{s2}(\lambda)$ may be similar to the recognition characteristic function of human sight, i.e., more similar to the recognition characteristic function of human sight than when a color filter is not employed. Thus, the peripheral light sensor 110' according to one or more aspects of the invention may effectively control the back light driver 120 so that a human's viewpoint may be embodied.

In embodiments of the invention, output characteristics of the peripheral light sensor 110' may be controlled by the number of transistors for which red, green, and blue filters are arranged at a light receiving section. Further, the output characteristics of the peripheral light sensor 110' may be controlled by adjusting sizes of transistors, e.g., channel width W/L with respect to a channel length of the semiconductor layer 520*c*.

Moreover, although FIG. 2 and FIG. 5 show N-type transistors M, M1 through M3, embodiments of the present invention are not limited thereto. For example, transistors M, M1 through M3 may be constructed by a P-type transistor.

In a peripheral light sensor and a liquid crystal display device using the same according to one or more aspects of the present invention, a color filter may be arranged at a light receiving section of at least one transistor in a peripheral light sensor in which a plurality of transistors are connected to each other in parallel. Accordingly, output characteristics of the peripheral light sensor can be designed to be similar to the recognition characteristics of human sight.

Therefore, embodiments of the present invention may effectively control the back light driver from a human's viewpoint and/or may reduce power consumption.

Exemplary embodiments of the present invention have been disclosed herein, and although specific terms are employed, they are used and are to be interpreted in a generic and descriptive sense only and not for purpose of limitation.

Accordingly, it will be understood by those of ordinary skill in the art that various changes in form and details may be made without departing from the spirit and scope of the present invention as set forth in the following claims.

What is claimed is:

1. A peripheral light sensor, comprising:
   at least two transistors connected between an output line and a ground power source, a peripheral light sensing signal corresponding to an intensity of a peripheral light being output through the output line; and
   a color filter over a light receiving section of at least one of the transistors.

2. The peripheral light sensor as claimed in claim 1, wherein the color filter is one of red, green, and blue color filters.

3. The peripheral light sensor as claimed in claim 1, further comprising:
   a first substrate on which the transistors are arranged;
   a second substrate facing the first substrate;
   a black matrix between the transistors and the second substrate, the black matrix including at least one opening portion,
   wherein the light receiving section overlaps the opening portion of the black matrix.

4. The peripheral light sensor as claimed in claim 3, wherein the color filter is disposed in at least a part of the opening portion of the black matrix to overlap with the light receiving section of at least a portion of at least one of the transistors.

5. The peripheral light sensor as claimed in claim 3, wherein the black matrix overlaps source and drain regions of the transistors.

6. The peripheral light sensor as claimed in claim 1, wherein the light receiving section of each transistor is at least a portion of a gate electrode of the respective transistor.

7. The peripheral light sensor as claimed in claim 1, wherein gate electrodes of the transistors are coupled to the ground power source and respective first electrodes thereof, the ground power source has a voltage value less than a maximal value of a voltage supplied to the output line.

8. The peripheral light sensor as claimed in claim 1, wherein a pulse wave signal swing between a first voltage and a second voltage is supplied to the output line of the peripheral light sensor, the second voltage has a greater voltage value than that of the first voltage.

9. The peripheral light sensor as claimed in claim 8, wherein the voltage value of the first voltage is identical with that of the ground power source, and the voltage value of the second voltage is set to be greater than that of the ground power source.

10. The peripheral light sensor as claimed in claim 1, wherein the transistors control a current amount flowing to the first electrode from a second electrode corresponding to an intensity of the peripheral light input to a gate electrode of the respective transistor.

11. The peripheral light sensor as claimed in claim 1, wherein:
   the light receiving section of at least one of the two transistors overlaps a green color filter;
   the light receiving section of at least another of the two transistors overlaps a blue color filter; and
   the light receiving section of a third transistor overlaps a red color filter.

12. The peripheral light sensor as claimed in claim 11, wherein the light receiving section of a fourth transistor does not overlap a color filter.

13. A liquid crystal display device, comprising:
   a pixel portion including a plurality of liquid crystal cells;
   at least one peripheral light sensor outputting a peripheral light sensing signal corresponding to an intensity of peripheral light sensed thereby;
   a back light for supplying light to the pixel portion; and
   a back light driver for controlling a luminance of light generated by the back light corresponding to the peripheral light sensing signal,
   wherein the peripheral light sensor includes:
   at least two transistors connected between an output line and a ground power source, the peripheral light sensing signal being output through the output line; and
   a color filter installed at a light receiving section of at least one of the transistors.

14. The liquid crystal display device as claimed in claim 13, further comprising a black matrix, a first substrate and a second substrate, wherein:
   the first substrate faces the second substrate,
   the at least two transistors are arranged on the first substrate,
   the black matrix is arranged between the first substrate and the second substrate, and
   the peripheral light sensor overlaps the black matrix.

15. The liquid crystal display device as claimed in claim 14, wherein the peripheral light sensor overlaps the black matrix at a peripheral region of the pixel portion.

16. The liquid crystal display device as claimed in claim 14, wherein the black matrix includes at least one opening portion, and the light receiving sections of the transistors at least partially overlap the at least one opening portion.

17. The liquid crystal display device as claimed in claim 16, wherein gate electrodes of the transistors correspond to the light receiving section of the transistors.

18. The peripheral light sensor as claimed in claim 13, wherein the color filter is one of red, green, and blue color filters.

19. The peripheral light sensor as claimed in claim 13, wherein gate electrodes of the transistors are coupled to a ground power source and first electrodes thereof, the ground power source has a voltage value less than a maximal value of a voltage supplied to the output line.

20. The peripheral light sensor as claimed in claim 13, wherein the transistors control a current amount flowing to the first electrode from a second electrode corresponding to an intensity of the peripheral light input to a gate electrode.

* * * * *